(12) United States Patent
Ogura

(10) Patent No.: US 12,133,466 B2
(45) Date of Patent: Oct. 29, 2024

(54) METHOD FOR MANUFACTURING VIBRATOR, VIBRATOR AND VIBRATOR DEVICE

(71) Applicant: Seiko Epson Corporation, Tokyo (JP)

(72) Inventor: Seiichiro Ogura, Minowa (JP)

(73) Assignee: SEIKO EPSON CORPORATION (JP)

( * ) Notice: Subject to any disclaimer, the term of this patent is extended or adjusted under 35 U.S.C. 154(b) by 791 days.

(21) Appl. No.: 17/361,450

(22) Filed: Jun. 29, 2021

(65) Prior Publication Data

US 2021/0408366 A1 Dec. 30, 2021

(30) Foreign Application Priority Data

Jun. 30, 2020 (JP) .................................. 2020-112533

(51) Int. Cl.
*H10N 30/04* (2023.01)
*H03H 9/19* (2006.01)
*H10N 30/072* (2023.01)
*H10N 30/08* (2023.01)
*H10N 30/20* (2023.01)

(52) U.S. Cl.
CPC ........... *H10N 30/04* (2023.02); *H10N 30/072* (2023.02); *H10N 30/08* (2023.02); *H10N 30/2047* (2023.02); *H03H 9/19* (2013.01)

(58) Field of Classification Search
CPC .. H10N 30/08; H10N 30/2047; H10N 30/072; H10N 30/04; H03H 9/19; H03H 3/077
See application file for complete search history.

(56) References Cited

U.S. PATENT DOCUMENTS

| 2010/0156237 A1 | 6/2010 | Ichikawa et al. |
| 2010/0201229 A1 | 8/2010 | Saito |
| 2015/0040664 A1 | 2/2015 | Ishii |
| 2019/0006575 A1 | 1/2019 | Yamaguchi et al. |

(Continued)

FOREIGN PATENT DOCUMENTS

| JP | 2006-311444 A | 11/2006 |
| JP | 2008-054273 A | 3/2008 |

(Continued)

*Primary Examiner* — J. San Martin
(74) *Attorney, Agent, or Firm* — Harness, Dickey & Pierce, P.L.C.

(57) ABSTRACT

A vibrator includes: a base portion; a vibrating arm including an arm portion which extends from the base portion, and a weight portion which is located on a tip end side of the arm portion and which has a first main surface and a second main surface that are in a front-back relationship; and a weight film disposed at the first main surface of the weight portion. The first main surface includes a planar surface and an inclined surface inclined with respect to the planar surface. A method for manufacturing a vibrator includes: a preparation step of preparing the above-described vibrator; and a removing step of removing a part of the weight film by emitting an energy ray to the weight film. In the removing step, the weight film disposed at the planar surface is removed and the weight film disposed at the inclined surface is not removed by emitting the energy ray to the weight film from a normal direction of the planar surface.

11 Claims, 8 Drawing Sheets

(56) References Cited

U.S. PATENT DOCUMENTS

| | | | |
|---|---|---|---|
| 2019/0229706 A1* | 7/2019 | Ogura | H03H 9/0547 |
| 2021/0237202 A1* | 8/2021 | Kawauchi | B23K 26/36 |
| 2021/0265973 A1* | 8/2021 | Kurita | H03H 9/0547 |
| 2021/0408365 A1* | 12/2021 | Ogura | G01C 19/5628 |
| 2022/0407499 A1* | 12/2022 | Kawauchi | H03H 3/04 |

FOREIGN PATENT DOCUMENTS

| | | |
|---|---|---|
| JP | 2010-147954 A | 7/2010 |
| JP | 2010-213262 A | 9/2010 |
| JP | 2013-197856 A | 9/2013 |
| JP | 2015-035734 A | 2/2015 |
| JP | 2019-012963 A | 1/2019 |
| JP | 2019-128211 A | 8/2019 |

* cited by examiner

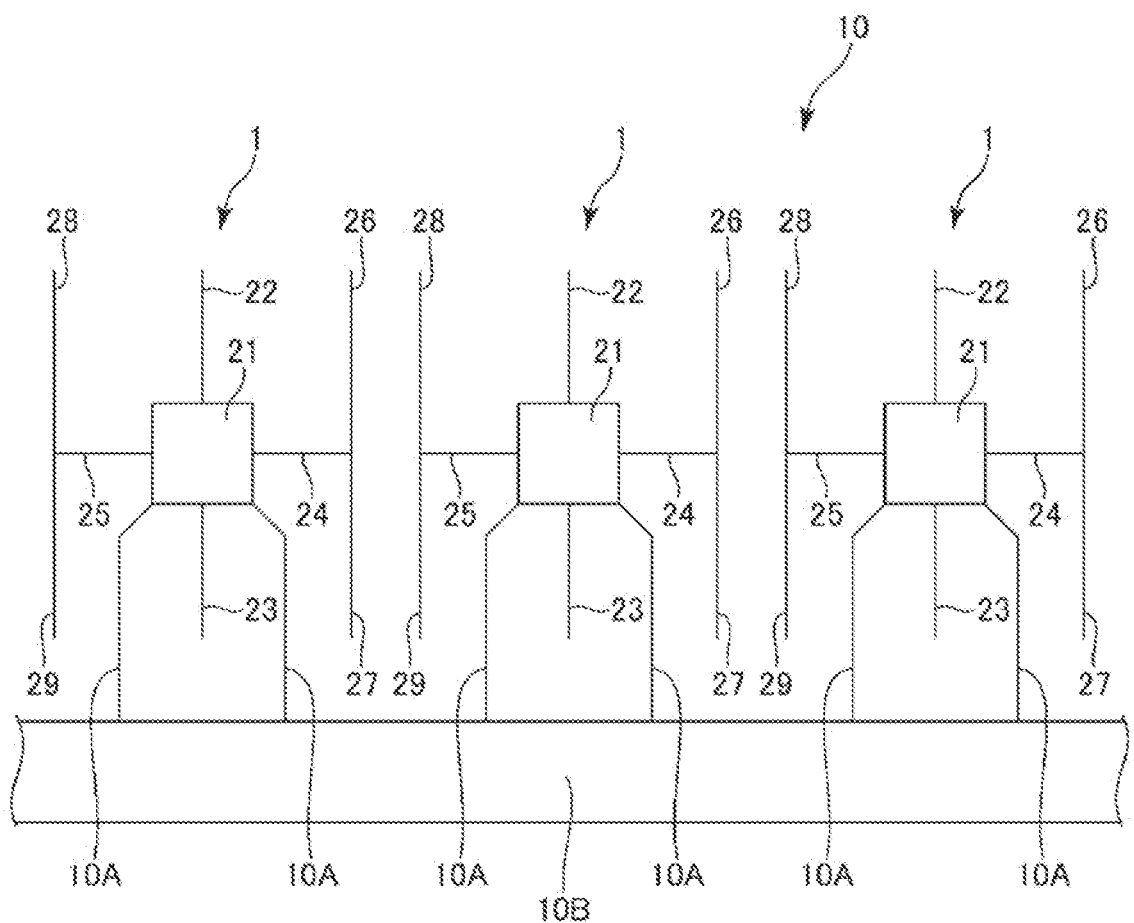
FIG. 9
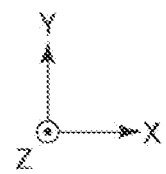

METHOD FOR MANUFACTURING VIBRATOR, VIBRATOR AND VIBRATOR DEVICE

The present application is based on, and claims priority from JP Application Serial Number 2020-112533, filed Jun. 30, 2020, the disclosure of which is hereby incorporated by reference herein in its entirety.

BACKGROUND

1. Technical Field

The present disclosure relates to a method for manufacturing a vibrator, a vibrator, and a vibrator device.

2. Related Art

JP A-2019-128211 discloses a vibrator including: a base portion; a vibrating arm which extends from the base portion and includes an arm portion and a weight portion; and a weight film formed at the weight portion. Further, an upper surface of the weight portion has a projecting shape, and includes a first planar surface and second planar surfaces that are located on both sides of the first planar surface and that are located closer to a lower surface than is the first planar surface, and inclined surfaces that couple the first planar surface and the second planar surfaces. Then, the weight film is formed to cross the first planar surface, the second planar surfaces, and the inclined surfaces. In such a vibrator, a frequency of the vibrator can be adjusted by irradiating a weight film with a laser beam to remove a part of the weight film.

However, in the vibrator described in JP A-2019-128211, when the laser beam is emitted to the weight film at the inclined surface, the laser beam is obliquely reflected according to an inclined angle of the inclined surface, and an unintended part is irradiated with the reflected laser, and therefore, an unintended process may be applied to the irradiated portion. For example, when the weight film or wiring on adjacent vibrating arms is irradiated with the reflected laser beam and this part is processed, there is a problem that frequency accuracy and reliability of the vibrator deteriorate.

SUMMARY

A method for manufacturing a vibrator according to the present disclosure, includes: a preparation step of preparing a vibrator, the vibrator including: a base portion, a vibrating arm including an arm portion which extends from the base portion, and a weight portion which is located on a tip end side of the arm portion and which has a first main surface and a second main surface that are in a front-back relationship, and a weight film disposed at the first main surface of the weight portion, the first main surface including a planar surface and an inclined surface inclined with respect to the planar surface; and a removing step of removing a part of the weight film by emitting an energy ray to the weight film, and in which in the removing step, the weight film disposed at the planar surface is removed and the weight film disposed at the inclined surface is not removed by emitting the energy ray to the weight film from a normal direction of the planar surface.

A vibrator according to the present disclosure includes: a base portion; a vibrating arm including an arm portion which extends from the base portion, and a weight portion which is located on a tip end side of the arm portion and which has a first main surface and a second main surface that are in a front-back relationship; and a weight film disposed on the first main surface of the weight portion, in which the first main surface includes a planar surface and an inclined surface inclined with respect to the planar surface, a part of the weight film is removed to form a processing mark recessed in a thickness direction of the vibrating arm, and the processing mark is not formed on the weight film disposed at the inclined surface, but is formed on the weight film disposed at the planar surface.

A vibrator device according to the present disclosure includes the vibrator; and a package which houses the vibrator.

BRIEF DESCRIPTION OF THE DRAWINGS

FIG. 9 is a plan view showing vibrators formed on a quartz crystal wafer.

DESCRIPTION OF EXEMPLARY EMBODIMENTS

Hereinafter, a method for manufacturing a vibrator, a vibrator, and a vibrator device according to the present disclosure will be described in detail based on the embodiments shown in the accompanying drawings.

First Embodiment

Figure 1:
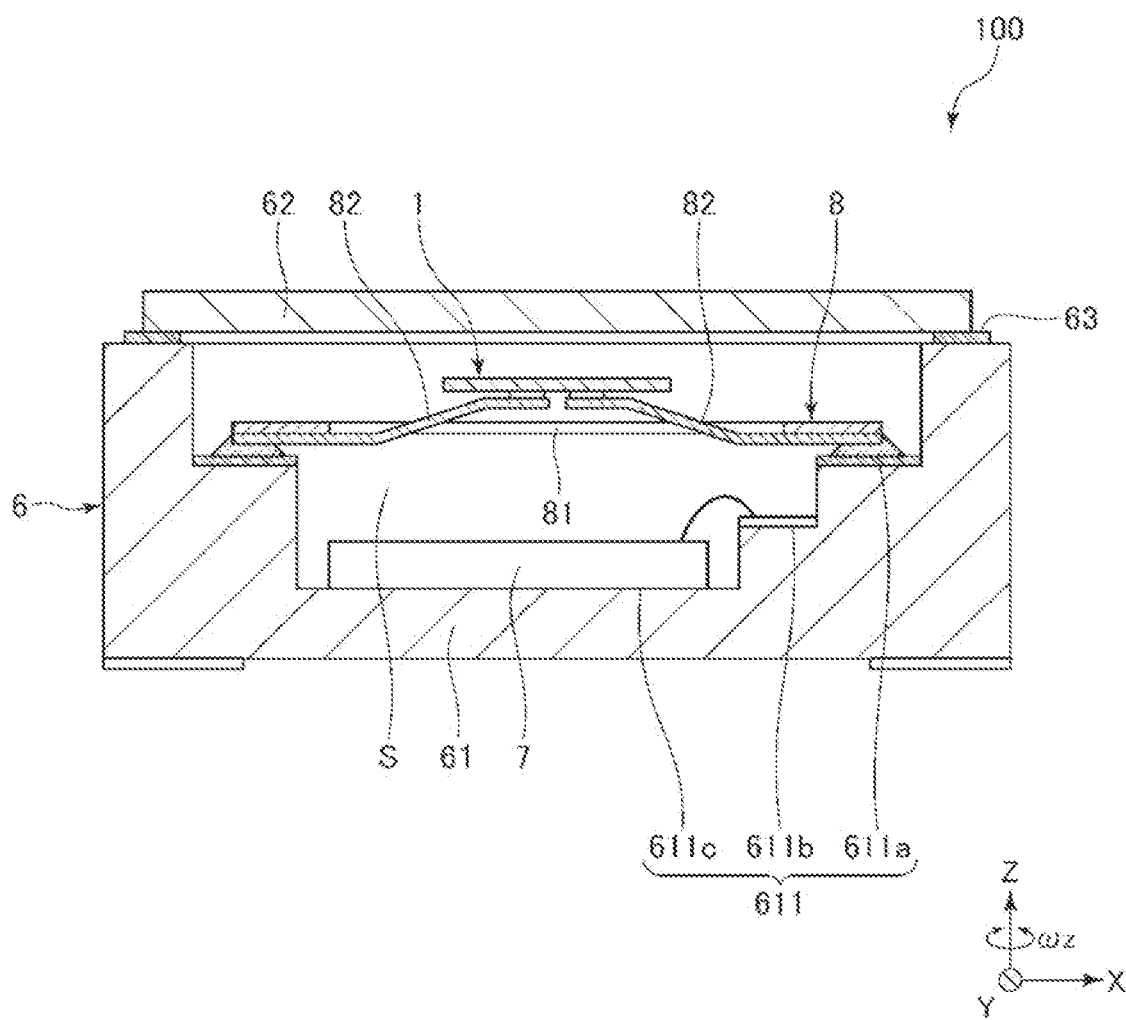
FIG. 1 is a cross-sectional view showing a vibrator device according to a first embodiment of the present disclosure.
Figure 2:
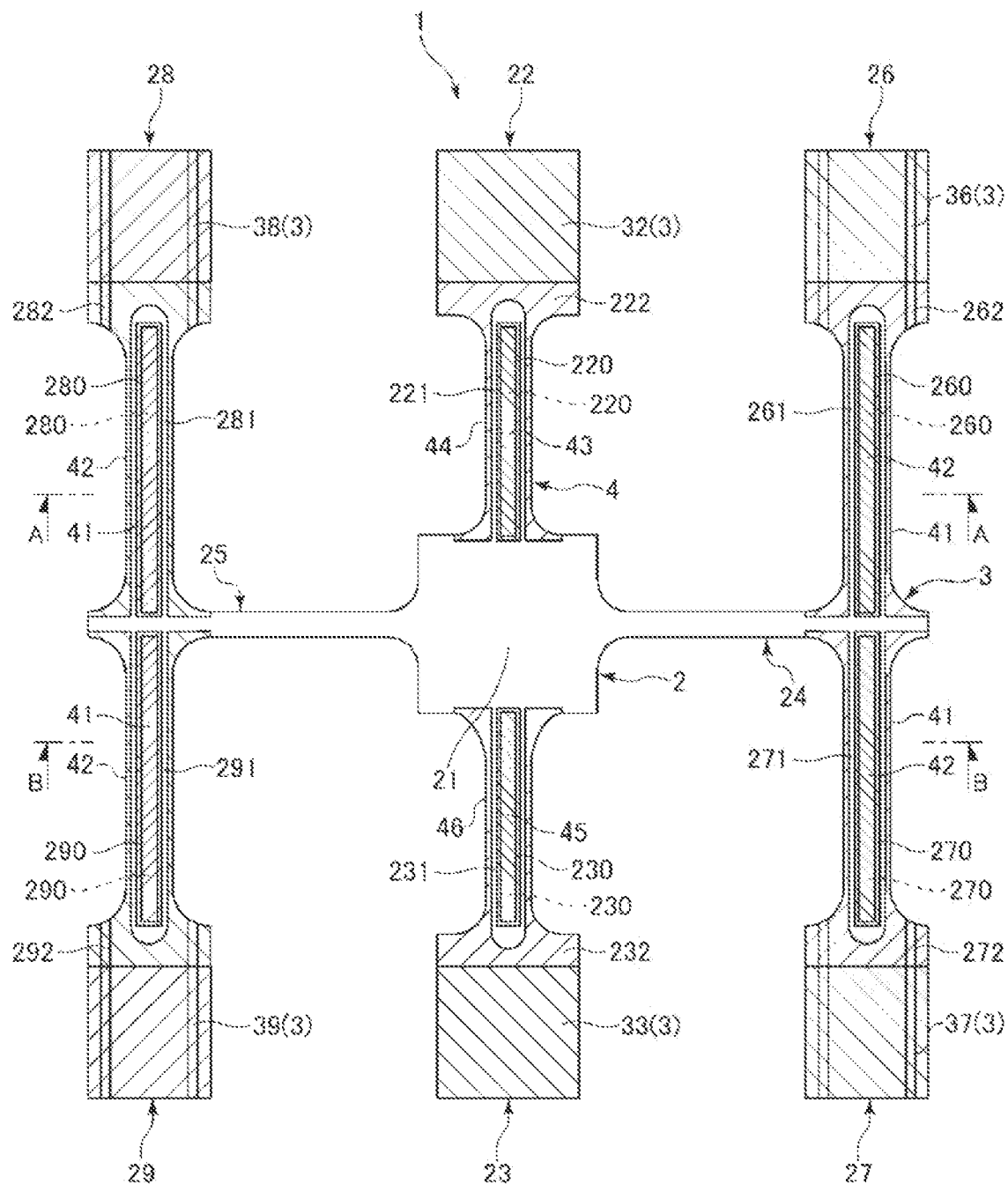
FIG. 2 is a plan view showing a vibrator of the vibrator device of FIG. 1.
Figure 3:
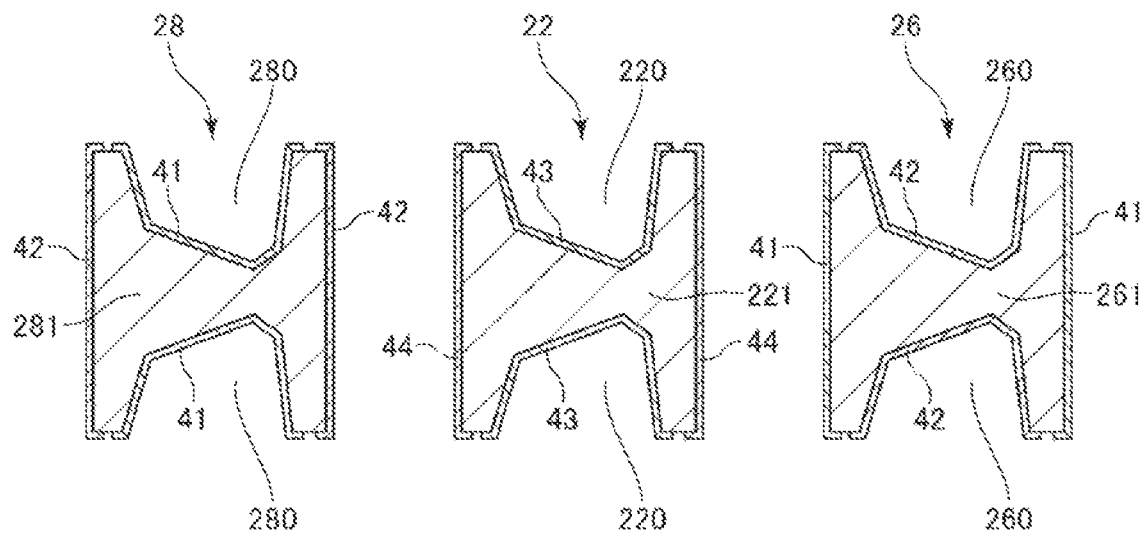
FIG. 3 is a cross-sectional view taken along a line A-A in FIG. 2.
Figure 4:
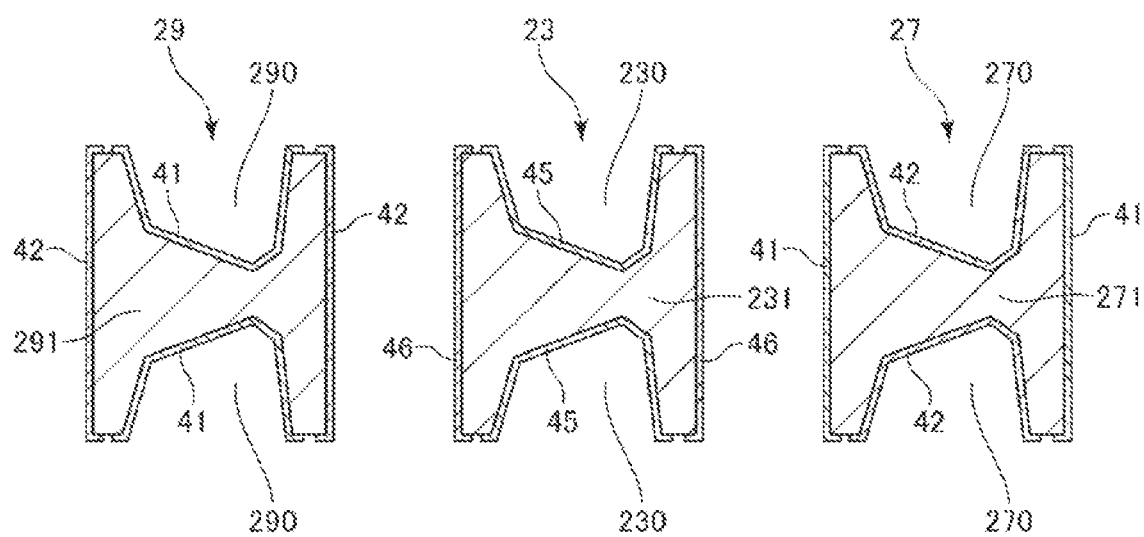
FIG. 4 is a cross-sectional view taken along a line B-B in FIG. 2.
Figure 5:
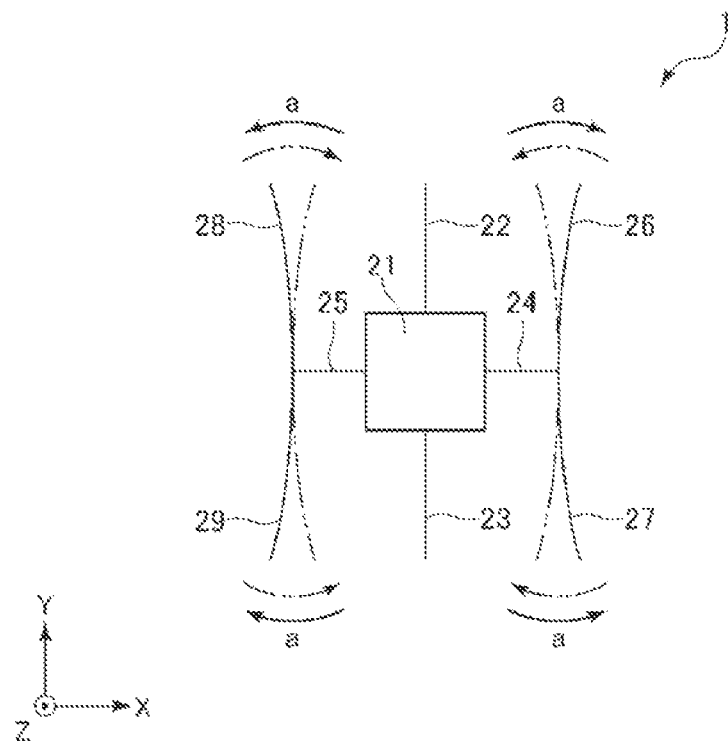
FIG. 5 is a schematic diagram showing a drive vibration mode of the vibrator.
Figure 6:
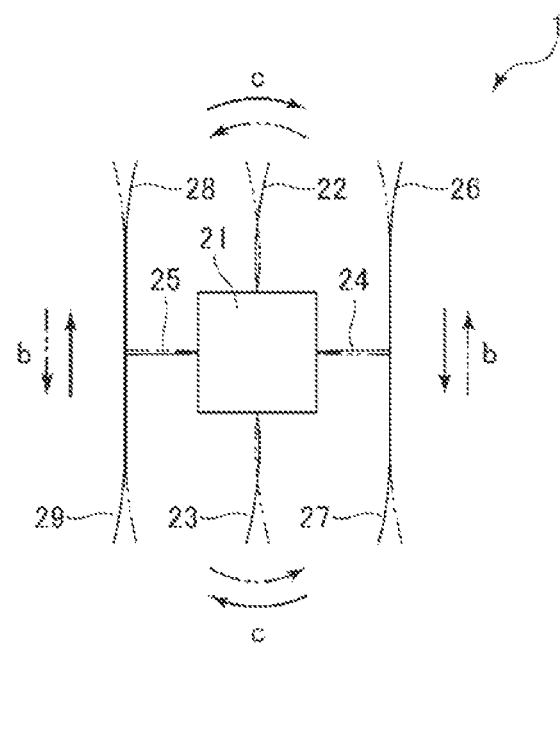
FIG. 6 is a schematic diagram showing a detection vibration mode of the vibrator.
Figure 7:
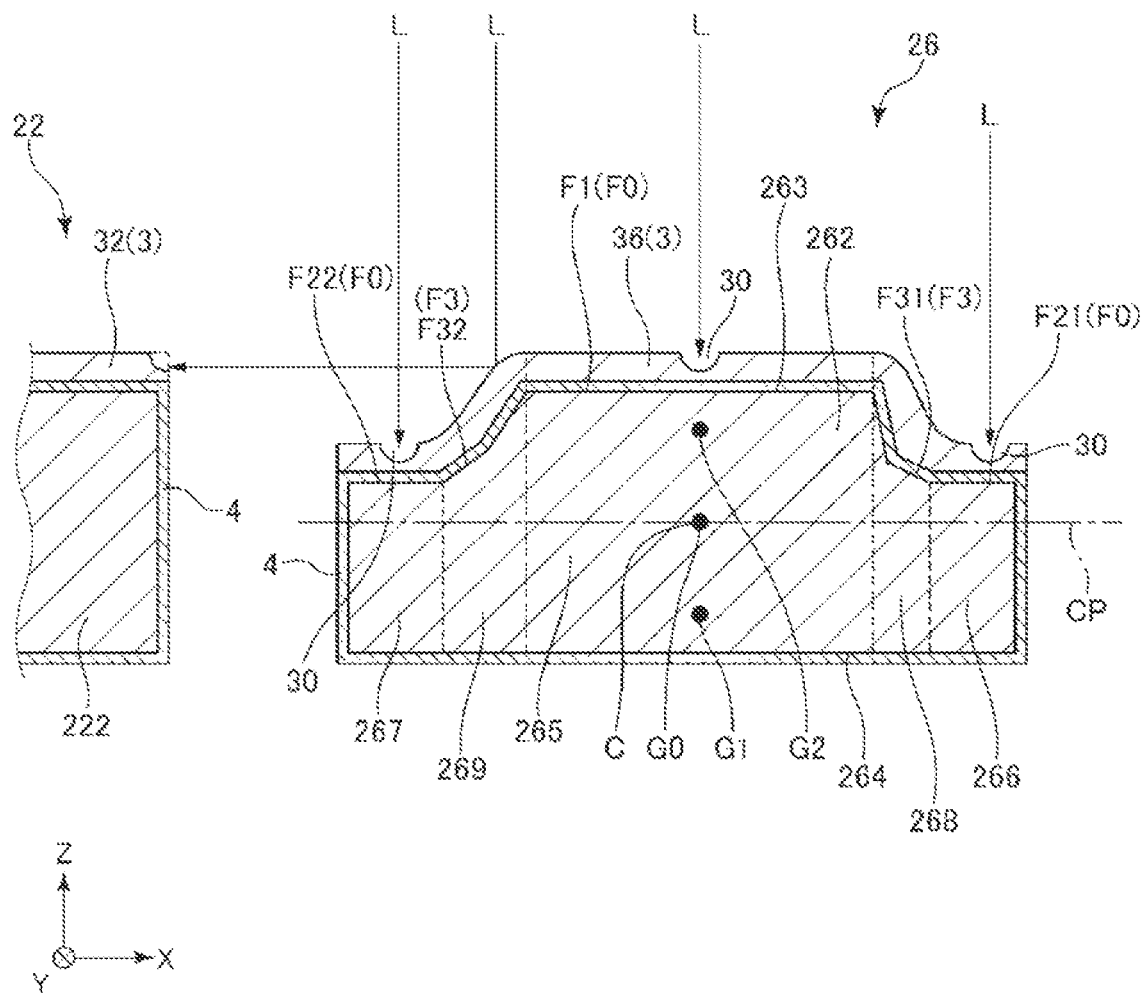
FIG. 7 is a cross-sectional view showing a weight portion of a drive arm.
Figure 8:
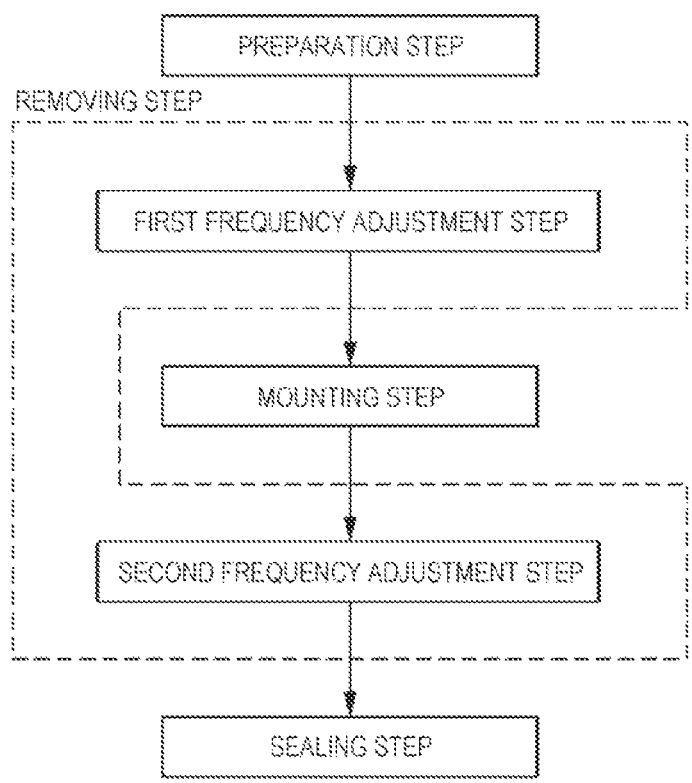
FIG. 8 is a diagram showing a manufacturing process of the vibrator device.

FIG. 1 is a cross-sectional view showing a vibrator device according to a first embodiment of the present disclosure. FIG. 2 is a plan view showing a vibrator of the vibrator device of FIG. 1. FIG. 3 is a cross-sectional view taken along a line A-A in FIG. 2. FIG. 4 is a cross-sectional view taken along a line B-B in FIG. 2. FIG. 5 is a schematic diagram showing a drive vibration mode of the vibrator. FIG. 6 is a schematic diagram showing a detection vibration mode of the vibrator. FIG. 7 is a cross-sectional view showing a weight portion of a drive arm. FIG. 8 is a diagram showing a manufacturing process of the vibrator device. FIG. 9 is a plan view showing vibrators formed on a quartz crystal wafer.

For convenience of description, each figure except FIG. 8 shows an X-axis, a Y-axis, and a Z-axis which are three axes orthogonal to each other. Further, a direction along the X-axis is also referred to as an "X-axis direction", a direction along the Y-axis is also referred to as a "Y-axis direction", and a direction along the Z-axis is also referred to as a "Z-axis direction". Further, an arrow side of each axis is also referred to as a plus side, and an opposite side is also referred to as a minus side. Further, the plus side in the Z-axis direction is also referred to as "upper", and the minus side is also referred to as "lower". Further, a plan view from the Z-axis direction is also simply referred to as a "plan view". The X-axis, the Y-axis, and the Z-axis also correspond to crystal axes of a quartz crystal, as will be described later.

Further, "parallel" described in the present specification includes a case where surfaces or lines are parallel to each other, and also includes a case where there is a slight deviation from parallel within a range that can be equated with parallel from the viewpoint of common technical knowledge. Similarly, "orthogonal" includes a case where faces or lines are orthogonal to each other, and also includes a case where there is a slight deviation from orthogonality within a range that can be equated with orthogonality from the viewpoint of common technical knowledge.

A vibrator device 100 shown in FIG. 1 is a physical quantity sensor that detects an angular velocity $\omega z$ with the Z-axis as a detection axis. By applying the vibrator device 100 to the physical quantity sensor, the vibrator device 100 can be widely mounted on various electronic devices, moving objects, and the like, and the vibrator device 100 is highly convenient and has high demand. The vibrator device 100 includes a package 6, a circuit element 7 housed in the package 6, a support substrate 8, and a vibrator 1.

The package 6 includes a base 61 having a recess portion 611 that is opened on an upper surface thereof, and a lid 62 that closes the opening of the recess portion 611 and that is joined to the upper surface of the base 61 via a joining member 63. An internal space S is formed inside the package 6, and the circuit element 7, the support substrate 8, and the vibrator 1 are housed in the internal space S. The internal space S is airtight and is in a decompressed state, preferably a state closer to vacuum. However, an atmosphere of the internal space S is not particularly limited, and may be, for example, an atmospheric pressure state or a pressurized state.

Further, the recess portion 611 is configured with a plurality of recess portions, and includes a recess portion 611a that is opened on the upper surface of the base 61, a recess portion 611b that is opened on a bottom surface of the recess portion 611a and has an opening width smaller than an opening width of the recess 611a, and a recess portion 611c that is opened on a bottom surface of the recess portion 611b and has an opening width smaller than the opening width of the recess portion 611b. Further, the support substrate 8 is fixed on the bottom surface of the recess portion 611a in a state in which the support substrate 8 supports the vibrator 1, and the circuit element 7 is fixed on a bottom surface of the recess portion 611c.

The circuit element 7 includes a drive circuit that drives the vibrator 1 and a detection circuit that detects, based on a signal output from the vibrator 1, an angular velocity $\omega z$ applied to the vibrator 1. The support substrate 8 is a substrate for mounting the vibrator 1 on the base 61. The support substrate 8 includes a frame-shaped substrate 81 and a plurality of leads 82 provided on the substrate 81. The substrate 81 is fixed to the bottom surface of the recess portion 611a. Further, the vibrator 1 is fixed to a tip end portion of each lead 82, and the vibrator 1 and the circuit element 7 are electrically coupled via internal wiring (not shown) formed on each lead 82 and the base 61.

The vibrator 1 is an angular velocity detection element that detects the angular velocity $\omega z$. As shown in FIG. 2, the vibrator 1 includes a vibrator element 2, an electrode film 4 disposed at the vibrator element 2, and a weight film 3 disposed at the electrode film 4.

The vibrator element 2 is made of a Z cut quartz crystal substrate. The Z cut quartz crystal substrate has an extension in an X-Y plane defined by the X-axis as an electrical axis, which is a crystal axis of the quartz crystal, and the Y-axis as a mechanical axis, and has a thickness in a direction along the Z-axis as an optical axis. The vibrator element 2 may be made of a piezoelectric material other than quartz crystal. Examples of the piezoelectric material other than the quartz crystal include lithium tantalate, lithium niobate, lithium borate, barium titanate, and the like. Further, depending on a configuration of the vibrator element 2, the vibrator element 2 may be made of a quartz crystal plate having a cut angle other than the Z cut. Further, the vibrator element 2 may be made of a material having no piezoelectricity, for example, silicon and the like. In this case, a piezoelectric element that expands and contracts due to energization may be disposed at each arm portion to be described later.

The vibrator element 2 includes a base portion 21 located at a center portion of the element, a pair of detection arms 22, 23 extending from the base portion 21 to both sides in a Y-axis direction, a pair of coupling arms 24, 25 extending from the base portion 21 to both sides in an X-axis direction, a pair of drive arms 26, 27 extending from a tip end portion of the coupling arm 24 to both sides in the Y-axis direction, and a pair of drive arms 28, 29 extending from a tip end portion of the coupling arm 25 to both sides in the Y-axis direction. In the present embodiment, the drive arms 26, 27, 28, and 29 correspond to a "vibrating arm" according to the present disclosure.

The detection arm 22 includes an arm portion 221 extending from the base portion 21 to the plus side in the Y-axis direction, a weight portion 222 located on a tip end side of the arm portion 221 and having a width larger than that of the arm portion 221 in the X-axis direction, and a pair of grooves 220 formed on upper and lower surfaces of the arm portion 221. Similarly, the detection arm 23 includes an arm portion 231 extending from the base portion 21 to the minus side in the Y-axis direction, a weight portion 232 located on a tip end side of the arm portion 231 and having a width larger than that of the arm portion 231 in the X-axis direction, and a pair of grooves 230 formed on upper and lower surfaces of the arm portion 231. These detection arms 22, 23 are formed symmetrically with respect to the base portion 21.

Further, the drive arm 26 includes an arm portion 261 extending from the tip end portion of the coupling arm 24 to the plus side in the Y-axis direction, a weight portion 262 located on a tip end side of the arm portion 261 and having a width larger than that of the arm portion 261 in the X-axis direction, and a pair of grooves 260 formed on upper and lower surfaces of the arm portion 261. Similarly, the drive arm 27 includes an arm portion 271 extending from the tip end portion of the coupling arm 24 to the minus side in the Y-axis direction, a weight portion 272 located on a tip end side of the arm portion 271 and having a width larger than that of the arm portion 271 in the X-axis direction, and a pair of grooves 270 formed on upper and lower surfaces of the arm portion 271. These drive arms 26, 27 are formed symmetrically with respect to the coupling arm 24.

Further, the drive arm 28 includes an arm portion 281 extending from the tip end portion of the coupling arm 25 to the plus side in the Y-axis direction, a weight portion 282 located on a tip end side of the arm portion 281 and having a width larger than that of the arm portion 281 in the X-axis direction, and a pair of grooves 280 formed on upper and lower surfaces of the arm portion 281. Similarly, the drive arm 29 includes an arm portion 291 extending from the tip end portion of the coupling arm 25 to the minus side in the Y-axis direction, a weight portion 292 located on a tip end side of the arm portion 291 and having a width larger than that of the arm portion 291 in the X-axis direction, and a pair of grooves 290 formed on upper and lower surfaces of the arm portion 291. These drive arms 28, 29 are formed symmetrically with respect to the coupling arm 25.

Further, as shown in FIGS. 3 and 4, the electrode film 4 formed at a surface of the vibrator element 2 includes drive signal electrodes 41, drive ground electrodes 42, first detection signal electrodes 43, first detection ground electrodes 44, second detection signal electrodes 45, and second detection ground electrodes 46.

The drive signal electrodes 41 are disposed at both side surfaces of the arm portion 261, both side surfaces of the arm portion 271, the upper and lower surfaces of the arm portion 281, and the upper and lower surfaces of the arm portion 291. On the other hand, the drive ground electrodes 42 are disposed at the upper and lower surfaces of the arm portion 261, the upper and lower surfaces of the arm portion 271, both side surfaces of the arm portion 281, and both side surfaces of the arm portion 291. Further, the first detection signal electrodes 43 are disposed at the upper and lower surfaces of the arm portion 221, and the first detection ground electrodes 44 are disposed at both side surfaces of the arm portion 221. On the other hand, the second detection signal electrodes 45 are disposed at the upper and lower surfaces of the arm portion 231, and the second detection ground electrodes 46 are disposed at both side surfaces of the arm portion 231. Although not shown, each of these electrodes 41 to 46 is routed back to the lower surface of the base portion 21 and electrically coupled to the corresponding one of the plurality of leads 82.

Further, the electrode film 4 is also disposed at the weight portions 222, 232, 262, 272, 282, and 292. Then, in the weight portion 222, the first detection ground electrodes 44 disposed at both side surfaces of the arm portion 221 are electrically coupled to each other by the electrode film 4 disposed at the weight portion 222. Similarly, in the weight portion 232, the second detection ground electrodes 46 disposed at both side surfaces of the arm portion 231 are electrically coupled to each other by the electrode film 4 disposed at the weight portion 232. Further, in the weight portion 262, the drive signal electrodes 41 disposed at both side surfaces of the arm portion 261 are electrically coupled to each other by the electrode film 4 disposed at the weight portion 262. Similarly, in the weight portion 272, the drive signal electrodes 41 disposed at both side surfaces of the arm portion 271 are electrically coupled to each other by the electrode film 4 disposed at the weight portion 272. Further, in the weight portion 282, the drive ground electrodes 42 disposed at both side surfaces of the arm portion 281 are electrically coupled to each other by the electrode film 4 disposed at the weight portion 282. Similarly, in the weight portion 292, the drive ground electrodes 42 disposed at both side surfaces of the arm portion 291 are electrically coupled to each other by the electrode film 4 disposed at the weight portion 292.

The vibrator 1 having such a configuration detects the angular velocity ωz as follows. First, when a drive signal is applied between the drive signal electrode 41 and the drive ground electrode 42, the drive arms 26 to 29 perform flexural vibration in the X-axis direction along the X-Y plane as shown by an arrow a in FIG. 5. Hereinafter, the drive mode is referred to as a drive vibration mode. Then, a detection vibration mode shown in FIG. 6 is newly excited when the angular velocity ωz is applied to the vibrator 1 in a state in which the drive arms 26 to 29 are driven in the drive vibration mode. In the detection vibration mode, the Coriolis force in the Y-axis direction orthogonal to the X-axis, which is a vibration direction, and the Z-axis, which is an input axis, acts on the drive arms 26 to 29 to excite vibration in a direction shown by an arrow b, and in response to the vibration, detection vibration, which is flexural vibration of the detection arms 22, 23 in a direction shown by an arrow c, is generated.

Then, in the detection vibration mode, a charge generated at the detection arm 22 is taken as a first detection signal between the first detection signal electrode 43 and the first detection ground electrode 44, and a charge generated at the detection arm 23 is taken as a second detection signal between the second detection signal electrode 45 and the second detection ground electrode 46. The angular velocity ωz can be detected based on the first and second detection signals.

As shown in FIG. 2, the weight film 3 is disposed at the upper surfaces of the weight portions 222, 232, 262, 272, 282, and 292. In the weight film 3 on these weight portions, the weight film 3 on the weight portions 262, 272, 282, and 292 is a weight for adjusting a resonance frequency (resonance frequency of each of the drive arms 26 to 29) and a vibration balance in the drive vibration mode, and the weight film 3 on the weight portions 222, 232 is a weight for adjusting a resonance frequency (resonance frequency of each of the detection arms 22, 23) and a vibration balance in the detection vibration mode.

Next, configurations of the weight portions 262, 272, 282, and 292 will be described in detail. However, since the weight portions 262, 272, 282, and 292 have the same configuration as one another, in the following, for convenience of description, the weight portion 262 will be described as a representative, and description of the configurations of other weight portions 272, 282, and 292 will be omitted.

As shown in FIG. 7, the weight portion 262 is disposed so as to face the Z-axis direction, which is a thickness direction of the drive arm 26, and has an upper surface 263 as a first main surface and a lower surface 264 as a second main surface, which are in a front-back relationship with each other. Further, in the plan view, the weight portion 262 includes a thick portion 265, which is located on an extension line of the arm portion 261 and which has the same thickness as the arm portion 261, a pair of thin portions 266, 267, which are located on both sides of the thick portion 265 in a width direction, that is, in the X-axis direction, and which are thinner than the thick portion 265, an inclined portion 268, which is located between the thick portion 265 and the thin portion 266 and whose thickness decreases from the thick portion 265 side toward the thin portion 266 side, and an inclined portion 269, which is located between the thick portion 265 and the thin portion 267 and whose thickness decreases from the thick portion 265 side toward the thin portion 267 side.

Further, the thin portions 266, 267 are disposed on and biased to the lower surface 264 side. Then, on the lower surface 264 side, the thick portion 265, the thin portion 266, 267, and the inclined portions 268, 269 are continuously coupled without a step. Therefore, the lower surface 264 of the weight portion 262 is a planar surface in the X-Y plane. On the other hand, on the upper surface 263 side, steps formed by the inclined portions 268, 269 are formed between the thick portion 265 and the thin portions 266, 267. Therefore, the upper surface 263 of the weight portion 262 has a projecting shape. Accordingly, since the thin portions 266, 267 are biased toward the lower surface 264, a center of gravity G1 of the weight portion 262 is located on the lower surface 264 side with respect to a central plane CP which is the X-Y plane intersecting a center C in the thickness direction of the drive arm 26.

The upper surface 263 having the projecting shape has a planar surface F0 formed in the X-Y plane and an inclined surface F3 inclined with respect to the planar surface F0. Further, the planar surface F0 includes a first planar surface F1 which is flush with the upper surface of the vibrator element 2 and a pair of second planar surfaces F21, F22 which are located on both sides of the first planar surface F1 in the X-axis direction and which are closer to the lower surface 264 than is the first planar surface F1. The first planar surface F1 is an upper surface of the thick portion 265, the second planar surface F21 is an upper surface of the thin portion 266, and the second planar surface F22 is an upper surface of the thin portion 267. The first planar surface F1 and the second planar surfaces F21, F22 are parallel to one another and are formed in the X-Y plane orthogonal to the Z-axis direction, which is a thickness direction of the vibrator element 2.

Further, the inclined surface F3 includes a first inclined surface F31, which is located between the first planar surface F1 and the second planar surface F21 and couples the first planar surface F1 and the second planar surface F21, and a second inclined surface F32, which is located between the first planar surface F1 and the second planar surface F22 and couples the first planar surface F1 and the second planar surface F22. The first inclined surface F31 is an upper surface of the inclined portion 268, and the second inclined surface F32 is an upper surface of the inclined portion 269. Each of the first inclined surface F31 and the second inclined surface F32 is at least one planar surface obtained by rotating the X-Y plane around the Y-axis.

As will be described later in a method for manufacturing the vibrator device 100, an outer shape and a projecting shape of the upper surface 263 of the vibrator element 2 are formed by patterning a quartz crystal wafer, which is adjusted to a thickness of the vibrator element 2 in advance by a polishing process, using dry etching. Therefore, in the upper surface 263, the first planar surface F1 is a polished surface, and each of other surfaces, that is, each of the second planar surfaces F21, F22 and the first and second inclined surfaces F31, F32, is an etched surface. The etched surface is a crystal surface of a quartz crystal that appears by the wet etching. In the configuration shown in FIG. 7, the first inclined surface F3l is formed by two crystal surfaces having different inclinations, but the number of crystal surfaces appearing on the first inclined surface F3l varies depending on an etching speed and an etching depth, and is not particularly limited. The same applies to the second inclined surface F32.

Next, the weight film 3 will be described. As shown in FIG. 2, the weight film 3 includes a weight film 32 disposed at the weight portion 222 of the detection arm 22, a weight film 33 disposed at the weight portion 232 of the detection arm 23, a weight film 36 disposed at the weight portion 262 of the drive arm 26, a weight film 37 disposed at the weight portion 272 of the drive arm 27, a weight film 38 disposed at the weight portion 282 of the drive arm 28, and a weight film 39 disposed at the weight portion 292 of the drive arm 29.

The weight films 36, 37, 38, and 39 are films for adjusting the resonance frequency and the vibration balance in the drive vibration mode, and adjust the resonance frequency and the vibration balance by removing a part thereof by emitting a laser beam L which is an energy ray. Further, the weight films 32, 33 are films for adjusting the resonance frequency and the vibration balance in the detection vibration mode, and adjust the resonance frequency and the vibration balance by removing a part thereof by emitting the laser beam L which is an energy ray.

Next, configurations of the weight films 36, 37, 38, and 39 will be described. Since the weight films 36, 37, 38, and 39 have the same configuration as one another, in the following, for convenience of description, the weight film 36 will be described as a representative, and description of the configurations of the other weight films 37, 38, and 39 will be omitted.

As shown in FIG. 7, the weight film 36 is disposed at the upper surface 263 of the weight portion 262, and is not disposed at the lower surface 264 and the side surfaces. Further, the weight film 36 is provided over the entire weight portion 262 in a width direction, that is, the X-axis direction, except for a part of the weight portion 262 on a base end side. Therefore, a center of gravity G2 of the weight film 36 is located on the upper surface 263 side with respect to the central plane CP of the drive arm 26. That is, the center of gravity G2 is located on an opposite side of the central plane CP from the center of gravity G1 of the weight portion 262. Accordingly, a center of gravity G0 of the entire structure including the weight portion 262 and the weight film 36 can be brought close to the central plane CP, and preferably can be matched as shown in FIG. 7. Therefore, unnecessary vibration of the drive arm 26 in the drive vibration mode, particularly flexural vibration in the Z-axis direction can be reduced, vibration leakage is reduced, and the detection accuracy of the angular velocity ωz is improved.

A position, a size, a range, and the like of the weight film 36 are not limited to the position, the size, the range, and the like shown in FIG. 7. For example, the weight film 36 may be disposed at the lower surface 264 or the side surfaces of the weight portion 262 in addition to the upper surface 263. In this case, the thickness, the arrangement, and the like may be adjusted such that the center of gravity G2 of the weight film 36 is located closer to the upper surface 263 than is the central plane CP. Further, the weight film 36 may be provided over the entire weight portion 262 in a length direction, that is, the Y-axis direction.

A constituent material of the weight film 3 is not particularly limited, and for example, a metal, an inorganic compound, a resin, and the like can be used, but it is preferable to use a metal or an inorganic compound. The metal or the inorganic compound can be easily and highly accurately formed into a film by a vapor phase film forming method. Further, the weight film 3 made of a metal or an inorganic compound can be removed efficiently and with high accuracy by being irradiated with the laser beam L which is the energy ray.

As the laser beam L, for example, YAG, YVO4, a pulsed laser such as an excimer laser, a continuously oscillating laser such as a carbon dioxide gas laser, and the like can be used. Further, as the energy ray, in addition to the laser beam L, for example, an ion beam such as a focused ion beam (FIB) or an ion beam figuring (IBF) can be used.

In the present embodiment, a pulsed laser beam is used as the laser beam L. That is, the weight film 36 is processed by continuously emitting the laser beam L focused in a spot shape. Accordingly, by using the pulsed laser beam as the laser beam L, an irradiation amount of the laser beam L, that is, the an energy amount per unit area of the weight film 36 can be controlled by changing an irradiation time and an irradiation pitch while keeping an intensity of the laser beam L constant without change. Therefore, the laser beam L is stable, and the weight film 36 can be processed with high accuracy.

As shown in FIG. 7, when the weight film 36 is irradiated with the laser beam L, a part or all of the irradiated portion is removed and a processing mark 30 recessed from the surface is formed. If a part of the portion irradiated with the laser beam L is removed, the weight film 36 of the portion is thinned, and the processing mark 30 is a recess portion as shown in FIG. 7. Further, if the entire portion irradiated with the laser beam L is removed, the processing mark 30 is a through hole. The processing mark 30 may be any of a recess portion and a through hole. Further, as described above, since the pulsed laser beam is used as the laser beam L, the processing mark 30 has a substantially circular spot shape. However, a plan view shape of the processing mark 30 is not particularly limited.

The vibrator 1 is characterized at a position where the processing mark 30 is formed. Specifically, as shown in FIG. 7, the processing mark 30 is not formed at the weight film 36 on the inclined surface F3 of the upper surface 263, but is formed at the weight film 36 on the planar surface F0. When the weight film 36 on the inclined surface F3 is irradiated with the laser beam L from the Z-axis direction, the laser beam L is reflected in the X-axis direction according to an inclined angle of the inclined surface F3, the reflected laser beam L is unintentionally emitted to other parts of the vibrator 1, and unintended processing marks 30 are formed in the irradiated parts. For example, as shown in FIG. 7, when a laser beam L reflected by the weight film 36 on the inclined surface F3 is emitted to the weight film 32 of the adjacent detection arm 22 and a part of the weight film 32 is removed, a detuning frequency may deviate from a set value, or the vibration balance in the detection vibration mode may deteriorate.

Further, when the laser beam L reflected by the weight film 36 on the inclined surface F3 is emitted to the electrode film 4 of the adjacent detection arm 22, and a part of the first detection signal electrode 43 or the first detection ground electrode 44 is removed, these electrodes 43, 44 may be decoupled, resulting in a defective product which cannot detect the angular velocity ωz or whose detection accuracy is significantly reduced. Therefore, a manufacturing yield of the vibrator device 100 is lowered. Further, even if the product is non-defective during shipment, the vibrator device 100 may break down due to decoupling starting from an unintended processing mark 30 during use on the user side, which leads to a decrease in the reliability of the vibrator device 100.

In particular, in the present embodiment, the inclined surface F3 is an etched surface, and a surface roughness is larger than that of the first planar surface F1 which is a polished surface. Therefore, the surface roughness of the weight film 36 on the inclined surface F3 tends to be large. Therefore, the laser beam L reflected by the weight film 36 on the inclined surface F3 is not only specularly reflected, but also diffusely reflected in various directions, and is emitted over a wide range to each part located around the drive arm 26. Therefore, the above-described problem may become more prominent. Further, since a reflection direction of the laser beam L changes depending on an irregular shape of a surface of the weight film 36, it is also difficult to perform control such as adjustment of a direction of emitting the laser beam L such that the reflected laser beam L is not emitted to other parts of the vibrator 1.

Therefore, the laser beam L is not emitted to the weight film 36 on the inclined surface F3 and is emitted to the weight film 36 on the planar surface F0. That is, the processing mark 30 is not formed on the weight film 36 on the inclined surface F3, but is formed on the weight film 36 on the planar surface F0. Accordingly, the laser beam L is reflected in the Z-axis direction, which is a thickness direction of the vibrator 1, it is possible to effectively prevent other parts located around the drive arm 26 from being unintentionally irradiated with the reflected laser beam L and prevent formation of unintended processing marks 30 on these parts. Therefore, the vibrator 1 having excellent vibrating characteristics and reliability is obtained.

The planar surface F0 of the present embodiment includes the first planar surface F1 and the second planar surfaces F21, F22 located on both sides in the X-axis direction thereof. According to such a configuration, a larger area to which the laser beam L is emitted can be secured, and the weight film 36 having a larger adjustment width is obtained. Further, by selecting a surface to be irradiated with the laser beam L from the first planar surface F1 and the second planar surfaces F21, F22, a position of the center of gravity G0 in the X-axis direction can be adjusted, and a mass balance in the width direction of the entire structure can be adjusted more easily.

As described above, since the second planar surfaces F21, F22 are etched surfaces, the surface roughness is larger than that of the first planar surface F1 which is a polished surface. Therefore, the surface roughness of the weight film 36 on the second planar surfaces F21, F22 tend to be large as that on the inclined surface F3. Further, the second planar surfaces F21, F22 are recessed closer to the lower surface 264 than is the first planar surface F1. Therefore, compared to the laser beam L reflected by the weight film 36 on the first planar surface F1, the laser beam L reflected by the weight film 36 on the second planar surfaces F21, F22 is likely to be diffusely reflected, and although not as much as the laser beam L reflected by the weight film 36 on the inclined surface F3, there is a possibility that other parts located around the drive arm 26 are irradiated.

Therefore, it is particularly preferable that the laser beam L is not emitted to the weight film 36 on the second planar surfaces F21, F22 and is emitted the weight film 36 on the first planar surface F1. That is, it is preferable that the processing mark 30 is not formed on the weight film 36 on the second planar surfaces F21, F22, but is formed on the weight film 36 on the first planar surface F1. Accordingly, it is possible to more effectively prevent other parts located around the drive arm 26 from being unintentionally irradiated with the laser beam L reflected by the weight film 36 and prevent the formation of processing marks 30 on these parts.

A configuration of the vibrator device 100 was described above. Next, while descripting the method for manufacturing the vibrator device 100, a method for manufacturing the vibrator 1 will be described. As shown in FIG. 8, the method for manufacturing the vibrator device 100 includes: a preparation step of preparing the vibrator 1; a first frequency adjustment step of adjusting a frequency of the vibrator 1 on a quartz crystal wafer 10; a mounting step of mounting the vibrator 1 on the base 61; a second frequency adjustment step of adjusting the frequency of the vibrator 1 on the base 61; and a sealing step of joining the lid 62 to the base 61. The method for manufacturing the vibrator 1 includes the preparation step and a removing step which includes the first frequency adjustment step and the second frequency adjustment step among these steps.

Preparation Step

First, the quartz crystal wafer 10 is prepared, both main surfaces of the quartz crystal wafer 10 are flattened by performing various polishing processes such as a lapping process and a polishing process on both main surfaces thereof, and a thickness of the quartz crystal wafer 10 is set to the thickness of the vibrator element 2. Next, the quartz crystal wafer 10 is patterned by wet etching (anisotropic etching), and a plurality of vibrator elements 2 are formed on the crystal wafer 10. In the vibrator element 2 formed in this way, the first planar surface F1 of the upper surface 263 of the weight portion 262 is a polished surface, and other second planar surfaces F21, F22 and the first and second inclined surfaces F31, F32 are etched surfaces.

Next, the electrode film 4 is formed at the surface of the vibrator element 2 by sputtering and the like, and the weight film 3 is further formed at the electrode film 4 by vapor deposition and the like. Accordingly, as shown in FIG. 9, a plurality of vibrators 1 are integrally formed on the quartz crystal wafer 10. In FIG. 9, for convenience of description, the vibrator 1 is shown in a simplified manner, and each vibrator 1 is coupled to a frame 10B via a coupling beam 10A.

First Frequency Adjustment Step

Next, the resonance frequency and the vibration balance of the vibrator 1 are adjusted on the quartz crystal wafer 10. Specifically, the weight films 36, 37, 38, and 39 are irradiated with the laser beam L to remove a part of the weight films 36, 37, 38, and 39 and reduce a mass of the drive arms 26, 27, 28, and 29, and thus the resonance frequency of the vibrator 1 in the drive vibration mode is adjusted, and the vibration balance of the drive arms 26, 27, 28, and 29 is adjusted to reduce the vibration leakage in the drive vibration mode. Further, the weight films 32, 33 are irradiated with the laser beam L to remove a part of the weight films 32, 33 and reduce a mass of the detection arms 22, 23, the thus resonance frequency of the vibrator 1 in the detection vibration mode is adjusted to adjust the detuning frequency to a predetermined range, and the vibration balance of the detection arms 22, 23 is adjusted to reduce the vibration leakage in the detection vibration mode. This step may be performed as needed, and when this step is performed, whether removal is necessary for each of the weight films 32, 33, 36, 37, 38, and 39, and a removal amount and a formation position of the processing mark 30 if the removal is necessary can be selected.

This step may be omitted if this step is not necessary. Further, the resonance frequency and the vibration balance of the vibrator 1 may be adjusted by a method different from that of the present embodiment. Even when different methods are used, it is preferable that the weight film 3 on the inclined surface F3 is not irradiated with the energy ray as described above. As a different method, for example, a method for removing the weight film 3 by using an ion beam as an energy ray instead of the laser can be mentioned. In this case, since it is difficult to narrow down the ion beam in a spot shape as the laser beam L, the ion beam may be emitted through a mask such that the ion beam is not emitted to the weight film 3 on the inclined surface F3.

Since a method for emitting the laser beam L is as described above, in the following, a brief description will be given with reference to the above-described FIG. 7, with the weight film 36 as a representative. In this step, the laser beam L is emitted from the Z-axis direction, which is a normal direction of the planar surface F0. Further, the laser beam L is not emitted to the weight film 36 on the inclined surface F3, but is emitted to the weight film 36 on the planar surface F0. Accordingly, it is possible to effectively prevent an unintended portion of the vibrator 1 or other vibrators 1 formed on the quartz crystal wafer 10 from being irradiated with the laser beam L reflected by the weight film 36, and prevent the irradiated part from being unintentionally processed. Therefore, deterioration of the vibration characteristics and the reliability of the vibrator 1 can be effectively prevented.

In particular, in the present embodiment, the inclined surface F3 is an etched surface, and a surface roughness is larger than that of the first planar surface F1 which is a polished surface. Therefore, the surface roughness of the weight film 36 on the inclined surface F3 tends to be large. Therefore, the laser beam L reflected by the weight film 36 on the inclined surface F3 is not only specularly reflected, but also diffusely reflected in various directions, and is emitted over a wide range to each part located around the drive arm 26. Therefore, the above-described problem becomes more prominent.

The planar surface F0 of the present embodiment includes the first planar surface F1 and the second planar surfaces F21, F22 located on both sides in the X-axis direction thereof. Therefore, a larger area to which the laser beam L is emitted can be secured, and the weight film 36 having a larger adjustment width is obtained. Further, by selecting a surface to be irradiated with the laser beam L from the first planar surface F1 and the second planar surfaces F21, F22, a position of the center of gravity G0 in the X-axis direction can be adjusted, and a mass balance in the width direction of the entire structure can be adjusted more easily.

Since the second planar surfaces F21, F22 are etched surfaces, the surface roughness is larger than that of the first planar surface F1 which is a polished surface. Therefore, the surface roughness of the weight film 36 on the second planar surfaces F21, F22 tend to be large as that on the inclined surface F3. Further, the second planar surfaces F21, F22 are positioned of being recessed closer to the lower surface 264 that is the first planar surface F1. Therefore, compared to the laser beam L reflected by the weight film 36 on the first planar surface F1, the laser beam L reflected by the weight film 36 on the second planar surfaces F21, F22 is likely to be diffusely reflected, and although not as much as the laser beam L reflected by the weight film 36 on the inclined surface F3, there is a possibility that other parts located around the drive arm 26 are irradiated.

Therefore, it is particularly preferable that the laser beam L is not emitted to the weight film 36 on the second planar surfaces F21, F22 and is emitted to the weight film 36 on the first planar surface F1. Accordingly, it is possible to more effectively prevent other parts located around the drive arm 26 from being unintentionally irradiated with the laser beam L reflected by the weight film 36 and prevent the formation of processing marks 30 on these parts.

Mounting Step

Next, the vibrator 1 is cut off from the quartz crystal wafer 10, and the cut-off vibrator 1 is joined to the base 61 via the support substrate 8.

Second Frequency Adjustment Step

By fixing the vibrator 1 to the base 61 in the mounting step, the resonance frequency and the vibration balance of the vibrator 1 in the drive vibration mode and the detection vibration mode may fluctuate from that on the quartz crystal wafer 10. Further, rough adjustment of the resonance frequency and the vibration balance is performed in the first frequency adjustment step, and fine adjustment is performed in this step. Therefore, in this step, a part of the weight film 3 is removed by the same method as in the first frequency adjustment step described above, and the resonance frequency and the vibration balance of the vibrator 1 are adjusted. This step may be omitted if this step is not necessary. Further, the resonance frequency and the vibration balance of the vibrator 1 may be adjusted by a method different from that in the first frequency adjustment step. Even when different methods are used, it is preferable that the weight film 3 on the inclined surface F3 is not irradiated with the energy ray as described above.

Sealing Step

Next, in a vacuum state, the lid 62 is seam-welded to the upper surface of the base 61 via, for example, the joining member 63 made of a seam ring. Accordingly, the internal space S is air-tightly sealed, and the vibrator device 100 is obtained.

The method for manufacturing the vibrator device 100 was described above. According to such a manufacturing method, an unintended part of the vibrator 1 can be prevented from being processed by the laser beam L during manufacturing, and therefore, deterioration of drive characteristics and reliability of the vibrator 1 can be prevented.

The vibrator device 100 and the method for manufacturing the vibrator device 100 were described in detail above. As described above, the vibrator 1 provided in such a vibrator device 100 includes: the base portion 21; the drive arm 26 as a vibrating arm including the arm portion 261 extending from the base portion 21 and the weight portion 262 which is located on the tip end side of the arm portion 261 and which has the upper surface 263 as the first main surface and the lower surface 264 as the second main surface that are in a front-back relationship; and the weight film 36 disposed at the upper surface 263 of the weight portion 262. Further, the upper surface 263 includes the planar surface F0 and the inclined surface F3 inclined with respect to the planar surface F0. Then, a part of the weight film 36 is removed to form a processing mark 30 recessed in the thickness direction of the drive arm 26, and the processing mark 30 is not formed on the weight film 36 disposed at the inclined surface F3, but is formed on the weight film 36 disposed at the planar surface F0.

Accordingly, in a step of forming the processing mark 30, it is possible to effectively prevent an unintended portion of the vibrator 1 or other vibrators 1 formed on the quartz crystal wafer 10 from being irradiated with the laser beam L reflected by the weight film 36, and prevent the irradiated part from being unintentionally processed. Therefore, deterioration of the vibration characteristics and the reliability of the vibrator 1 can be effectively prevented.

Further, as described above, the planar surface F0 includes the first planar surface F1, and the second planar surfaces F21, F22, which are coupled to the first planar surface F1 via the inclined surface F3, are located closer to the lower surface 264 than is the first planar surface F1, and are parallel to the first planar surface F1. Therefore, a larger area to which the laser beam L is emitted can be secured, and the weight film 36 having a larger adjustment width is obtained.

Further, as described above, in the plan view, the second planar surfaces F21, F22 are disposed on both sides of the first planar surface F1 in the width direction, that is, the X-axis direction orthogonal to the Y-axis direction which is an extending direction of the arm portion 261. According to such a configuration, by selecting a surface on which the processing mark 30 is formed from the first planar surface F1 and the second planar surfaces F21, F22, the position of the center of gravity G0 in the X-axis direction can be adjusted, and a mass balance in the width direction of the entire structure can be adjusted more easily.

Further, as described above, the processing mark 30 is not formed on the weight film 36 disposed at the second planar surfaces F21, F22, but is formed on the weight film 36 disposed at the first planar surface F1. Accordingly, in a step of forming the processing mark 30, it is possible to more effectively prevent an unintended portion of the vibrator 1 or other vibrators 1 formed on the quartz crystal wafer 10 from being irradiated with the laser beam L reflected by the weight film 36, and prevent the irradiated part from being unintentionally processed. Therefore, deterioration of the vibration characteristics and the reliability of the vibrator 1 can be more effectively prevented.

Further, as described above, the vibrator device 100 includes the vibrator 1 and the package 6 for housing the vibrator 1. Accordingly, the effect of the vibrator 1 can be enjoyed, and the vibrator device 100 having excellent vibrating characteristics and reliability is obtained.

Further, as described above, in the method for manufacturing the vibrator 1 included in the method for manufacturing the vibrator device 100, the vibrator 1 includes: the base portion 21; the drive arm 26 as a vibrating arm including the arm portion 261 extending from the base portion 21 and the weight portion 262 which is located on the tip end side of the arm portion 261 and which has the upper surface 263 as the first main surface and the lower surface 264 as the second main surface that are in a front-back relationship; and the weight film 36 disposed at the upper surface 263 of the weight portion 262. The upper surface 263 includes the planar surface F0 and the inclined surface F3 inclined with respect to the planar surface F0. The method for manufacturing the vibrator 1 includes: the preparation step of preparing the vibrator 1; and the removing step of removing a part of the weight film 36 by irradiating the weight film 36 with the laser beam L which is an energy ray. Then, in the removing step, the laser beam L is emitted to the weight film 36 from the Z-axis direction, which is the normal direction of the planar surface F0, the weight film 36 disposed at the inclined surface F3 is not removed and the weight 36 disposed at the planar surface F0 is removed.

Accordingly, in the removing step, it is possible to effectively prevent an unintended portion of the vibrator 1 or other vibrators 1 formed on the quartz crystal wafer 10 from being irradiated with the laser beam L reflected by the weight film 36, and prevent the irradiated part from being unintentionally processed. Therefore, deterioration of the vibration characteristics and the reliability of the vibrator 1 can be effectively prevented.

Further, as described above, the planar surface F0 includes the first planar surface F1, and the second planar surfaces F21, F22, which are coupled to the first planar surface F1 via the inclined surface F3, are located closer to the lower surface 264 than is the first planar surface F1, and are parallel to the first planar surface F1. Therefore, a larger area to which the laser beam L is emitted can be secured, and the weight film 36 having a larger adjustment width is obtained.

Further, as described above, in the plan view, the second planar surfaces F21, F22 are disposed on both sides of the first planar surface F1 in the width direction, that is, the X-axis direction orthogonal to the Y-axis direction which is an extending direction of the arm portion 261. According to such a configuration, by selecting a surface to be irradiated with the laser beam L from the first planar surface F1 and the second planar surfaces F21, F22, the position of the center of gravity G0 in the X-axis direction can be adjusted, and a mass balance in the width direction of the entire structure can be adjusted more easily.

Further, as described above, in the removing step, the laser beam L is emitted to the weight film 36, the weight film 36 disposed at the first planar surface F1 is removed and the weight film 36 disposed at the second planar surfaces F21, F22 is not removed. Accordingly, in the removing step, it is possible to more effectively prevent an unintended portion of the vibrator 1 or other vibrators 1 formed on the quartz crystal wafer 10 from being irradiated with the laser beam L reflected by the weight film 36, and prevent the irradiated part from being unintentionally processed. Therefore, deterioration of the vibration characteristics and the reliability of the vibrator 1 can be more effectively prevented.

The present embodiment was described above. The vibrator 1 of the present embodiment includes the drive arms 26, 27, 28, and 29 as vibrating arms, but the present disclosure is not limited thereto, and for example, the vibrator 1 may include at least one of the drive arms 26, 27, 28 and 29 as a vibrating arm. Further, at least one of the detection arms 22, 23 may be a vibrating arm instead of or in addition to the drive arms 26, 27, 28 and 29. That is, at least one of the detection arms 22, 23 may have the same configuration as the weight portion 262 and the weight film 36 described above. Further, in the method for manufacturing the vibrator 1, the removing step includes the first frequency adjustment step and the second frequency adjustment step, but the present disclosure is not limited thereto, and the removing step may include at least one of the first frequency adjustment step and the second frequency adjustment step. That is, the removing step may be performed on the quartz crystal wafer 10 or may be performed in a state where the vibrator 1 is mounted on the base 61. Further, in the first frequency adjustment step and the second frequency adjustment step, the vibration balance and the frequency are adjusted, but the present disclosure is not limited thereto, and only one of the vibration balance and the frequency may be adjusted.

Further, for example, in the present embodiment, the second planar surfaces F21, F22 are formed on both sides of the first planar surface F1 in the X-axis direction, but the arrangement of the second planar surfaces F21, F22 is not limited thereto. For example, the second planar surface may be formed on one side or both sides of the first planar surface F1 in the Y-axis direction, or may be formed in a frame shape so as to surround the periphery of the first planar surface F1 in the plan view. Further, one of the second planar surfaces F21, F22 may be omitted. The omission makes the first planar surface F1 wider, and when the laser beam L is emitted only to the first planar surface F1, there is an advantage that the irradiation area is increased.

Second Embodiment

Figure 10:
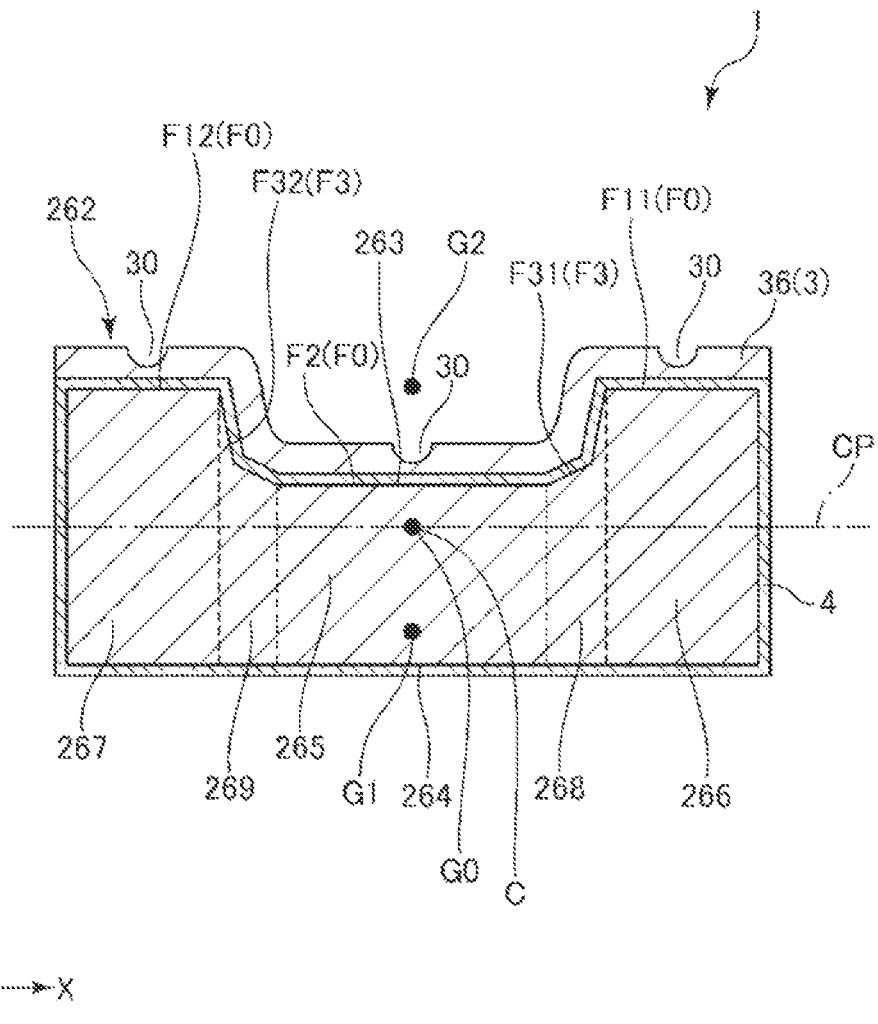
FIG. 10 is a cross-sectional view showing a vibrator according to a second embodiment of the present disclosure.

FIG. 10 is a cross-sectional view showing a vibrator according to a second embodiment of the present disclosure.

The vibrator device 100 according to the present embodiment is the same as the vibrator device 100 of the first embodiment described above, except that the configurations of the weight portions 262, 272, 282, and 292 of the vibrator 1 are different from those in the second embodiment. Therefore, in the following description, the vibrator device 100 according to the second embodiment will be described focusing on differences from the first embodiment, and the description of similar matters will be omitted. Further, in FIG. 10, a configuration similar to that of the above embodiment is donated by the same reference numeral. Since the weight portions 262, 272, 282, and 292 have the same configuration as one another, in the following, for convenience of description, the weight portion 262 will be described as a representative, and the description of the weight portions 272, 282, and 292 will be omitted.

As shown in FIG. 10, in the weight portion 262 of the present embodiment, the upper surface 263 has a recess shape, contrary to the above-described first embodiment. The upper surface 263 having the recess shape has the planar surface F0 in the X-Y plane and the inclined surface F3 inclined with respect to the planar surface F0. Further, the planar surface F0 includes: a pair of first planar surfaces F11, F12, which are flush with the upper surface of the vibrator element 2 and are disposed apart from each other in the X-axis direction; and a second planar surface F2, which is located between the pair of first planar surfaces F11, F12 and is located closer to the lower surface 264 than is the first planar surfaces F11, F12. The first planar surfaces F11, F12 and the second planar surface F2 are parallel to each other and are formed in the X-Y plane that orthogonal to the Z-axis direction, which is the thickness direction of the vibrator element 2.

The inclined surface F3 includes a first inclined surface F31, which is located between the first planar surface F11 and the second planar surface F2 and couples the first planar surface F11 and the second planar surface F2, and a second inclined surface F32, which is located between the first planar surface F12 and the second planar surface F2 and couples the first planar surface F12 and the second planar surface F2. According to such a configuration, by selecting a surface to be irradiated with the laser beam L from the first planar surfaces F11, F12 and the second planar surface F2, a position of the center of gravity G0 in the X-axis direction can be adjusted, and a mass balance in the width direction of the entire structure can be adjusted more easily. Further, as compared with the first embodiment described above, a mechanical strength of an outer peripheral portion of the weight portion 262 is increased, and therefore, for example, it is possible to prevent damage to the weight portion 262 caused by unintended contact with another portion when an excessive force is applied.

Further, the processing mark 30 is not formed on the weight film 36 on the inclined surface F3, and the processing mark 30 is formed on the weight film 36 on the planar surface F0. That is, in the removing step, the weight film 36 on the inclined surface F3 is not irradiated with the laser beam L and the weight film 36 on the planar surface F0 is irradiated with laser beam L. Accordingly, it is possible to effectively prevent other parts located around the drive arm 26 from being unintentionally irradiated with the laser beam L reflected by the weight film 36, and prevent formation of an unintended processing mark 30 on these parts. Therefore, the vibrator 1 having excellent vibrating characteristics and reliability is obtained.

As described above, in the vibrator 1 of the present embodiment, in the plan view, the first planar surfaces F11, F12 are disposed on both sides of the second planar surface F2 in the X-axis direction, which is the width direction, orthogonal to the Y-axis direction which is an extending direction of the arm portion 261. According to such a configuration, by selecting a surface to be irradiated with the laser beam L from the first planar surfaces F11, F12 and the second planar surfaces F2, the position of the center of gravity G0 in the X-axis direction can be adjusted, and a mass balance in the width direction of the entire structure can be adjusted more easily. Further, as compared with the first embodiment described above, a mechanical strength of an outer peripheral portion of the weight portion 262 is increased, and therefore, for example, it is possible to prevent damage to the weight portion 262 caused by unintended contact with another portion when an excessive force is applied.

In the second embodiment, the same effects as those of the first embodiment can also be exerted.

In the present embodiment, the first planar surfaces F11, F12 are formed on both sides of the second planar surface F2 in the X-axis direction, but the arrangement of the first planar surfaces F11, F12 is not limited thereto. For example, one of the first planar surfaces F11, F12 may be omitted. Further, the first planar surfaces F11, F12 may be formed on one side or both sides of the second planar surface F2 in the Y-axis direction, or may be formed in a frame shape so as to surround a periphery of the second planar surface F2 in the plan view.

The method for manufacturing the vibrator, the vibrator, and the vibrator device according to the present disclosure were described above based on the illustrated embodiments, but the present disclosure is not limited thereto, and a configuration of each part can be replaced with any configuration having the same function. Further, any other constituents may be added to the present disclosure. Further, each of the above-described embodiments may be combined as appropriate.

Further, the vibrator 1 is not limited to the above-described embodiments, and may be, for example, an H-type angular velocity detection element including a pair of detection arms extending from a base portion to a plus side in a Y-axis direction and a pair of drive arms extending from the base portion to a minus side in the Y-axis direction. In this case, in the drive vibration mode, the pair of drive arms vibrate in opposite phases in an X-axis direction, and when an angular velocity around the Y-axis is applied in this state, the Coriolis force acts, and the pair of detection arms vibrate in opposite phases in a Z-axis direction. Therefore, the angular velocity around the Y-axis can be detected based on a signal output from the detection arms. Further, the vibrator 1 may be an angular velocity detection element such as a bipod tuning fork type or a tripod tuning fork type. Further, the vibrator 1 is not limited to the angular velocity detection element, and may be, for example, a detection element for detecting a physical quantity other than the angular velocity, or an oscillation element such as that used for an oscillator.

What is claimed is:

1. A vibrator, comprising:
   a base portion;
   a vibrating arm including an arm portion which extends from the base portion, and a weight portion which is located on a tip end side of the arm portion and which has a first main surface and a second main surface that are in a front-back relationship; and
   a weight film disposed at the first main surface of the weight portion, wherein
   the first main surface includes a planar surface and an inclined surface inclined with respect to the planar surface,
   a part of the weight film is removed to form a processing mark recessed in a thickness direction of the vibrating arm, and
   the processing mark is not formed on the weight film disposed at the inclined surface, but is formed on the weight film disposed at the planar surface.

2. The vibrator according to claim 1, wherein
   the planar surface includes:
   a first planar surface, and
   a second planar surface which is coupled to the first planar surface via the inclined surface, is located closer to the second main surface than is the first planar surface, and is parallel to the first planar surface.

3. The vibrator according to claim 2, wherein
   the processing mark is not formed on the weight film disposed at the second planar surface, but is formed on the weight film disposed at the first planar surface.

4. The vibrator according to claim 2, wherein
   in a plan view, the second planar surface is disposed on both sides of the first planar surface in a width direction orthogonal to an extending direction of the arm portion.

5. The vibrator according to claim 2, wherein
   in a plan view, the first planar surface is disposed on both sides of the second planar surface in a width direction orthogonal to an extending direction of the arm portion.

6. A vibrator device, comprising:
   the vibrator according to claim 1; and
   a package which houses the vibrator.

7. A method for manufacturing a vibrator, comprising:
   a preparation step of preparing a vibrator, the vibrator including:
   a base portion;
   a vibrating arm including an arm portion which extends from the base portion, and a weight portion which is located on a tip end side of the arm portion and which has a first main surface and a second main surface that are in a front-back relationship; and
   a weight film disposed at the first main surface of the weight portion,
   the first main surface including a planar surface and an inclined surface inclined with respect to the planar surface; and
   a removing step of removing a part of the weight film by emitting an energy ray to the weight film, wherein
   in the removing step, the weight film disposed at the planar surface is removed and the weight film disposed at the inclined surface is not removed by emitting the energy ray to the weight film from a normal direction of the planar surface.

8. The method for manufacturing a vibrator according to claim 7, wherein
   the planar surface includes:
   a first planar surface, and
   a second planar surface which is coupled to the first planar surface via the inclined surface, is located closer to the second main surface than is the first planar surface, and is parallel to the first planar surface.

9. The method for manufacturing a vibrator according to claim 8, wherein
   in the removing step, the weight film disposed at the first planar surface is removed and the weight film disposed at the second planar surface is not removed by emitting the energy ray to the weight film.

10. The method for manufacturing a vibrator according to claim 8, wherein
    in a plan view, the second planar surface is disposed on both sides of the first planar surface in a width direction orthogonal to an extending direction of the arm portion.

11. The method for manufacturing a vibrator according to claim 8, wherein in a plan view, the first planar surface is disposed on both sides of the second planar surface in a width direction orthogonal to an extending direction of the arm portion.

\* \* \* \* \*